United States Patent [19]
Krishnamurthy et al.

[11] Patent Number: 5,825,206
[45] Date of Patent: Oct. 20, 1998

[54] FIVE VOLT SAFE OUTPUT BUFFER CIRCUIT THAT CONTROLS THE SUBSTRATE AND GATES OF THE PULL-UP DEVICES

[75] Inventors: Naveen Krishnamurthy, Sunnyvale; Thomas Shewchuk, Rancho Murieta, both of Calif.

[73] Assignee: Intel Corporation, Santa Clara, Calif.

[21] Appl. No.: 696,473

[22] Filed: Aug. 14, 1996

[51] Int. Cl.$^6$ .................... H03K 19/0175; H03K 19/094
[52] U.S. Cl. .................... 326/81; 326/86; 326/87
[58] Field of Search .................... 326/83, 81, 86, 326/87, 27; 327/170, 380, 381

[56] References Cited

U.S. PATENT DOCUMENTS

| | | | |
|---|---|---|---|
| 5,039,874 | 8/1991 | Anderson | 327/170 |
| 5,126,588 | 6/1992 | Reichmeyer et al. | 327/170 |
| 5,194,764 | 3/1993 | Yano et al. | 326/86 |
| 5,491,432 | 2/1996 | Wong et al. | 326/86 |
| 5,568,081 | 10/1996 | Lui et al. | 326/27 |
| 5,570,043 | 10/1996 | Churchill | 326/27 |
| 5,635,861 | 6/1997 | Chan et al. | 326/81 |

*Primary Examiner*—Michael J. Tokar
*Assistant Examiner*—Richard Roseen
*Attorney, Agent, or Firm*—Blakely, Sokoloff, Taylor & Zafman

[57] ABSTRACT

An input/output buffer for computer circuitry including a P type transistor device responsive to data signals for selectively furnishing voltage from a first source of potential at a buffer input/output terminal, a first predriver circuit for furnishing data signals from a source to the P type transistor device, the first predriver circuit including circuitry for slowing the application of data signals to the P type transistor device when the buffer input/output terminal is at a high level, a N type transistor device responsive to data signals for selectively furnishing voltage from a second source of potential at the buffer output terminal, a second predriver circuit for furnishing data signals from the source to the N type transistor device, and circuitry for slowing the receipt of data signals at the first predriver circuit.

15 Claims, 4 Drawing Sheets

5,825,206

FIVE VOLT SAFE OUTPUT BUFFER CIRCUIT THAT CONTROLS THE SUBSTRATE AND GATES OF THE PULL-UP DEVICES

BACKGROUND OF THE INVENTION

1. Field of the Invention

This invention relates to electronic systems and, more particularly, to methods and apparatus for providing an output buffer for joining computer circuitry utilizing a supply voltage of 3.3 volts to circuitry utilizing a supply voltage of five volts.

2. History of the Prior Art

Intel Corporation of Santa Clara, Calif., presently manufactures a microprocessor which internally utilizes a supply voltage of 3.3 volts and provides signals through an output buffer to circuitry utilizing a supply voltage of five volts. The microprocessor is designed to require less power than typical systems so that it may be used in portable and desktop computers.

The output buffer has displayed a number of problems which have reduced its capabilities and made its use less than economic.

First, the buffer tends to produce leakage currents during certain conditions which dissipate the energy available to run a computer using the microprocessor. Second, the buffer provides signal timing characteristics which barely meet specifications for circuitry with which it is used. Consequently, the yield of chips containing the buffer circuitry and the microprocessor is severely reduced thereby increasing the overall cost of the microprocessor. Third, the buffer produces output signals with intolerable undershoot and overshoot limiting the circuitry with which the microprocessor can be used. Finally, the buffer operates very slowly thereby limiting operation of the system with which it is used.

It is desirable to provide a new output buffer for a microprocessor which eliminates leakage currents, provides better timing characteristics, can be used in circuits with high capacitive loading, and operates more rapidly with less noise than prior art output buffers.

SUMMARY OF THE INVENTION

The present invention resolves the problems of the prior art by an input/output buffer for computer circuitry including a P type transistor device responsive to data signals for selectively furnishing voltage from a first source of potential at a buffer input/output terminal, a first predriver circuit for furnishing data signals from a source to the P type transistor device, the first predriver circuit including circuitry for slowing the application of data signals to the P type transistor device when the buffer input/output terminal is at a high level, a N type transistor device responsive to data signals for selectively furnishing voltage from a second source of potential at the buffer output terminal, a second predriver circuit for furnishing data signals from the source to the N type transistor device, and circuitry for slowing the receipt of data signals at the first predriver circuit.

These and other features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

In this specification, a signal which includes a "#" in its name is considered to be an active low signal. The term "assert" as applied to a signal indicates that signal is active independent of whether the level of the signal is low or high. The term "de-assert" indicates that a signal is inactive.

DETAILED DESCRIPTION

Figure 1:
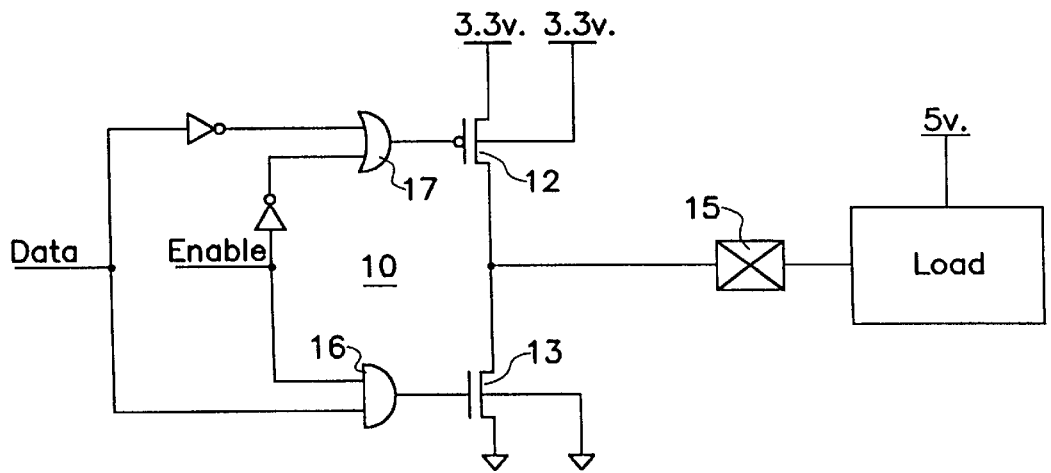
FIG. 1 is a circuit diagram of a typical prior art output buffer designed to be used with a microprocessor.

Referring now to FIG. 1, there is illustrated a circuit diagram illustrating a first prior art output buffer circuit 10. The circuit 10 is a typical output buffer utilized with computer circuitry. The circuit 10 includes a first P type output driver field effect transistor (FET) device 12 having drain and source terminals connected in circuit with the drain and source terminals of a second N type output driver field effect transistor device 13 between a supply voltage of 3.3 volts and ground. The transistor devices 12 and 13 control the voltage applied at an output terminal 15. If the device 12 is enabled by a low voltage (typically zero volts) applied at its gate terminal, the device 12 conducts; and 3.3 volts (a high value or "one") is applied at the output terminal 15. If instead, the device 13 is enabled by a high voltage (typically 3.3 volts) applied at its gate terminal, the device 13 conducts; and ground (a low value or "zero") is applied at the output terminal 15. The voltage at the output terminal 15 controls the values furnished by the final output driver circuits to be high or low.

Whether one or the other of the devices 12 or 13 is enabled so that the voltage at the terminal 15 is high or low depends on a voltage applied at a control (enable) terminal of the circuit 10 and transferred to predriver circuits 16 and 17. Predriver circuit 16 is typically a logical AND gate 16 which provides input to the gate terminal of the device 13. Predriver circuit 17 which receives the inverse of the enable voltage is typically a logical OR gate which provides input to the gate terminal of the device 12. If the enable voltage is high, the AND predriver circuit 16 transfers the sequence of input signals which appears at a data input terminal to the gate of the device 13; while the OR predriver circuit 17 which receives a low value from the enable input transfers the same sequence of input signals which appears at a data input terminal to the gate of the device 12. Since a high value at the gate of the device 13 enables that device while a high value at its gate disables the device 12, the presence of a high data value causes ground to be applied at the terminal 15 through the enabled device 13. A low data value, on the other hand, causes the supply voltage (e.g., 3.3 v.) to be furnished at the output terminal. When the enable input is low, the AND predriver circuit 16 furnishes a constant low value to disable the device 13 while the OR predriver circuit 17 furnishes a constant high value to disable the device 12.

In a typical circuit, the body of the transistor device 12 is connected to the source voltage; and the body of the transistor device 13 is connected to ground. When the output terminal 15 furnishes signals to circuitry having a five volt source voltage level, a number of undesirable effects can occur. When the two devices 12 and 13 are disabled (tristated), a voltage of 3.3 volts is applied at the gate of the device 12 and ground is applied at the gate of the device 13. If the terminal 15 receives five volts from the output circuit, this causes a leakage path to exist from the output terminal 15 to the voltage source of 3.3 volts through the drain-terminal-to-body diode of the device 12. This path dissipates substantial current and may damage the part. Device 12 turns on when the voltage at terminal 15 rises beyond Vcc+Vt (e.g., when the terminal 15 is pulled up to 5 volts) and dissipates power. In addition, the voltage between the terminal 15 and the gate of the device 13 is five volts, a voltage drop sufficiently large to appreciably shorten the life of the device 13. Moreover, when the device 12 is first enabled, its gate voltage switches from 3.3 v. to ground providing a voltage drop from gate to drain sufficiently large to appreciably shorten the life of the device 12.

Figure 2:
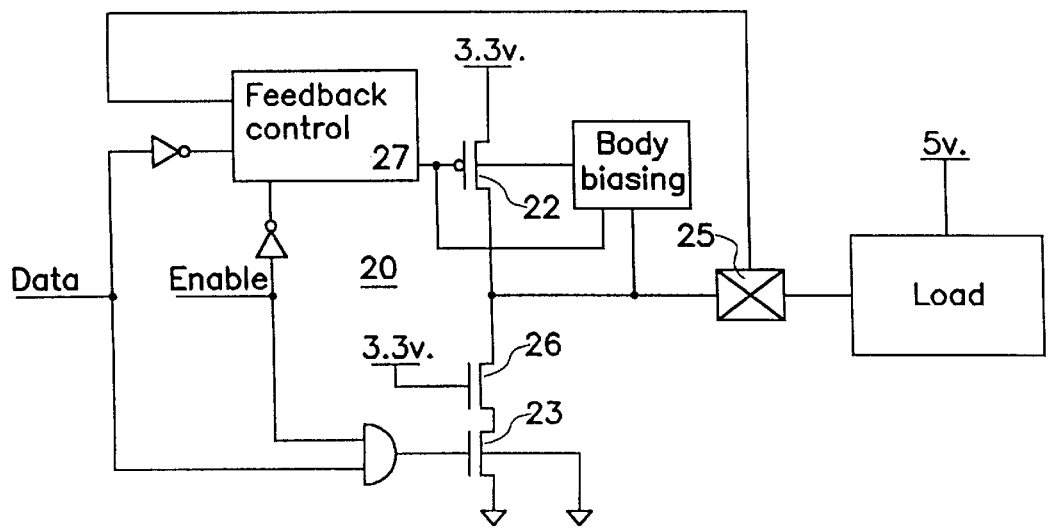
FIG. 2 is a circuit diagram of an improved prior art output buffer designed to be used with a microprocessor.

To overcome these difficulties, the prior art buffer circuit 20 of FIG. 2 was devised. In this circuit 20, a first P type output driver transistor 22 is connected in circuit with a second N type output driver transistor 23 between a supply voltage of 3.3 volts and ground. The transistor devices 22 and 23 control the voltage applied at an output terminal 25 to be 3.3 volts or ground depending on the device which is enabled. An additional N type device 26 is also placed in this serial path with its gate terminal biased by a value of 3.3 volts. The device 26 provides an additional threshold drop which lowers the voltage across the terminals of the device 23 to relieve the stress applied in the tristate condition.

The device 22 has its body joined to a body biasing circuit which detects the voltage level at the output terminal 25 and applies the value of voltage at the output terminal 25 to the body of the device 22 while the output buffer is disabled. Joining the body of device 22 to the body biasing circuit eliminates the leakage path through the body diode experienced by the device 12 in the circuit of FIG. 1. The body biasing circuit also applies a disabling voltage to the gate of the P device 22 when the output buffer is disabled and the voltage at the output terminal 25 is greater than 3.3 volts plus Vpt.

In addition, the buffer 20 includes a feedback circuit 27 which controls the voltage applied to the gate terminal of the device 22 when the output buffer 20 is driving data in accordance with the voltage value sensed at the output terminal 25. If the output terminal is at five volts and the buffer 20 is switching from the disabled to the enabled state, then the feedback circuit 27 controls the speed of application of the enabling gate voltage so that the value is gradually reduced from 3.3 v. toward ground.

By doing so, the voltage across the gate and drain terminals of the device 22 is kept from rising above the specification limit so that the device 22 is not overstressed.

Unfortunately, the feedback circuit 27 distorts the timing characteristics of the circuit 20 so that the device 22 switches on much more rapidly than the device 23 turns off. This reduces the minimum time during which the voltage at the terminal 25 can make a transition after a rising clock edge to be less than define in the specification for the device and the maximum time during which the voltage at the terminal 25 can make a transition after the rising clock edge to be greater than define in the specification for the device. This provides a much larger time window than desired which only just matches the specifications of the circuitry which follows. Because of this, a large percentage of chips are rejected for timing failures. The greatly increases the cost of the chips.

Moreover, the feedback circuit causes the timing to be such that both of the devices 22 and 23 are conducting together during a certain portion of the output cycle. This creates a direct path for current between the 3.3 volt supply source and ground which is a great waste of power, an undesirable feature for portable computers. In fact, many chips do not meet the power requirements for portable computers and are therefore rejected further increasing the cost of such devices.

The circuit 20 creates other problems in use. The chip of which the circuit 20 is a part is connected to drive both ceramic and plastic mounted packages. The ceramic mounted packages provide substantially more capacitive load than do the plastic packages. When used with ceramic packages, overshoot and undershoot occur at the output terminal 25. The values of overshoot and undershoot are substantial enough to cause malfunction of the internal circuitry of both the chip of which the circuit 20 is a part and the circuitry which it drives.

Figure 3:
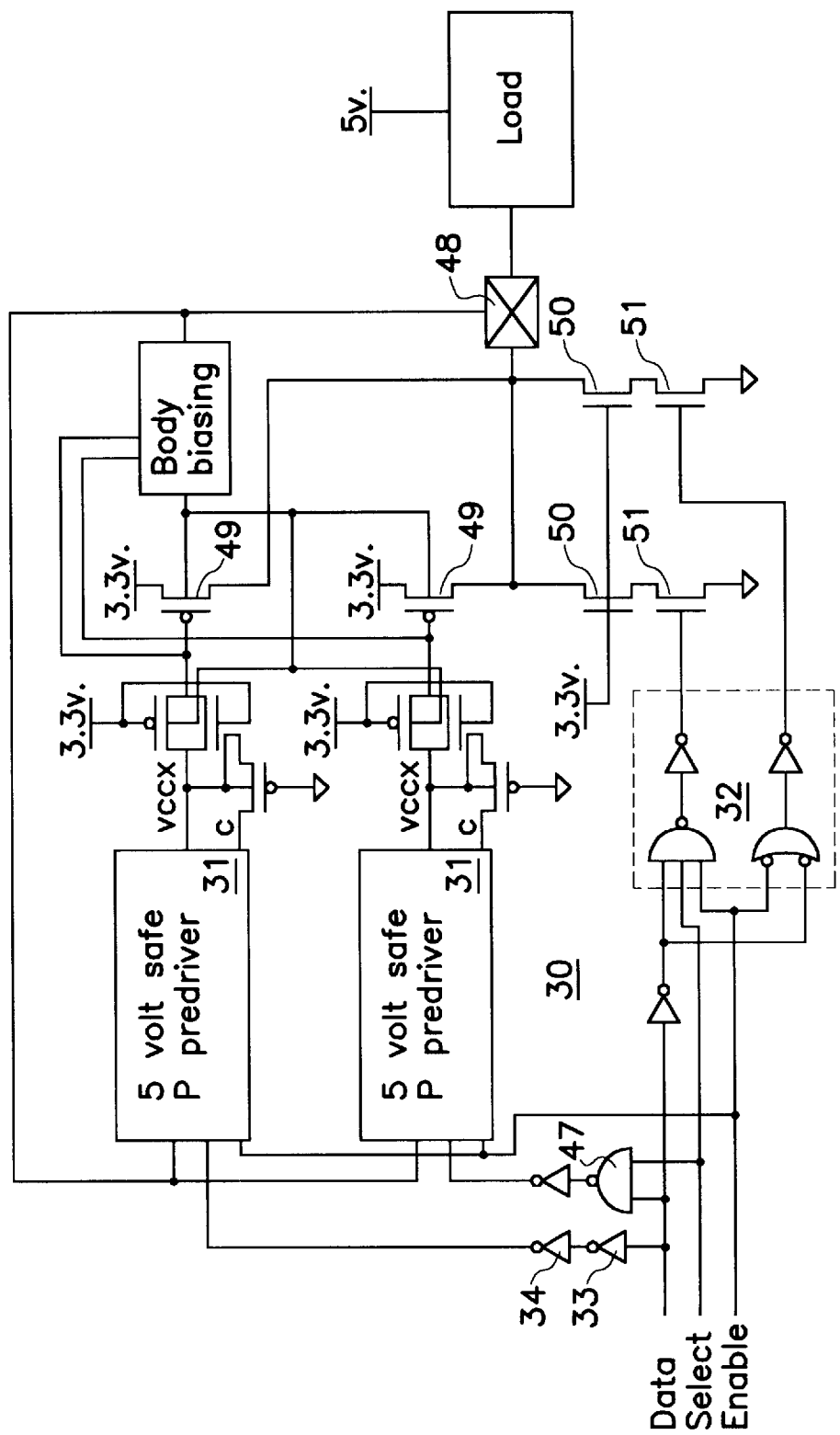
FIG. 3 is a circuit diagram of an output buffer designed in accordance with the present invention.

In order to assist in eliminating the problems demonstrated by the prior art buffer circuits illustrated in FIGS. 1 and 2, a new output buffer circuit with improved predriver circuits has been designed. FIG. 3 is a circuit diagram illustrating an output buffer 30 designed in accordance with the present invention to resolve the problems of the prior art. The buffer 30 includes a pair of predriver circuits 31 and 32. The predriver circuits 31 and 32 each receive a data input and an enabling input. The circuit 31 also receives a feedback input.

The circuit 30 has been improved in a number of ways from the prior art circuit of FIG. 2. In order to reduce the response to positive input data values and thereby limit the size of the window during which signals may be clocked to the output of the buffer 30, a pair of inverters 33 and 34 are placed in series between the data input terminal and one of a pair of P predriver circuits 31. Data input to a second one of the pair of P predriver circuits 31 is provided through a NAND gate 47 and another inverter in the presence of a SELECT signal. The inverters in the two paths are chosen to provide a delay to assist in reducing the maximum window provided during which the output voltage can make a transition after a rising clock edge by delaying the time at which data is applied to the predriver circuits 31 which furnish the high output values. In one embodiment, the values of inverters 33 and 34 (and NAND gate 47 and the associated inverter) are chosen such that the actual delay provided for the data signal is equal to approximately 0.6 nanoseconds.

As with the prior art buffers, the buffer 30 receives data from internal circuitry on a microprocessor chip operating with a 3.3 volt source voltage and transfers the data to circuitry offchip which utilizes a source voltage of five volts. To accomplish this, the input signals including the data and enable signals are all furnished to the predriver circuits 31 and 32 which transfer the input signals to the output drivers which produce the final output values. The predriver circuits 31 also receives feedback input which provides a high value when the voltage level at the buffer output terminal 48 is at 3.3 volts or above. The predriver circuits 31 and 32 furnish high and low output levels (typically 3.3 volts and ground) to gate terminals of P type FET transistor devices 49 and N type FET transistor devices 51. These high and low output values from the predrivers cause the output driver circuits to vary the data value furnished at an output terminal 48 joined to a node between the devices 49 and N type FET transistor devices 50. The devices 50 are joined through the devices 51 to ground.

Figure 5:
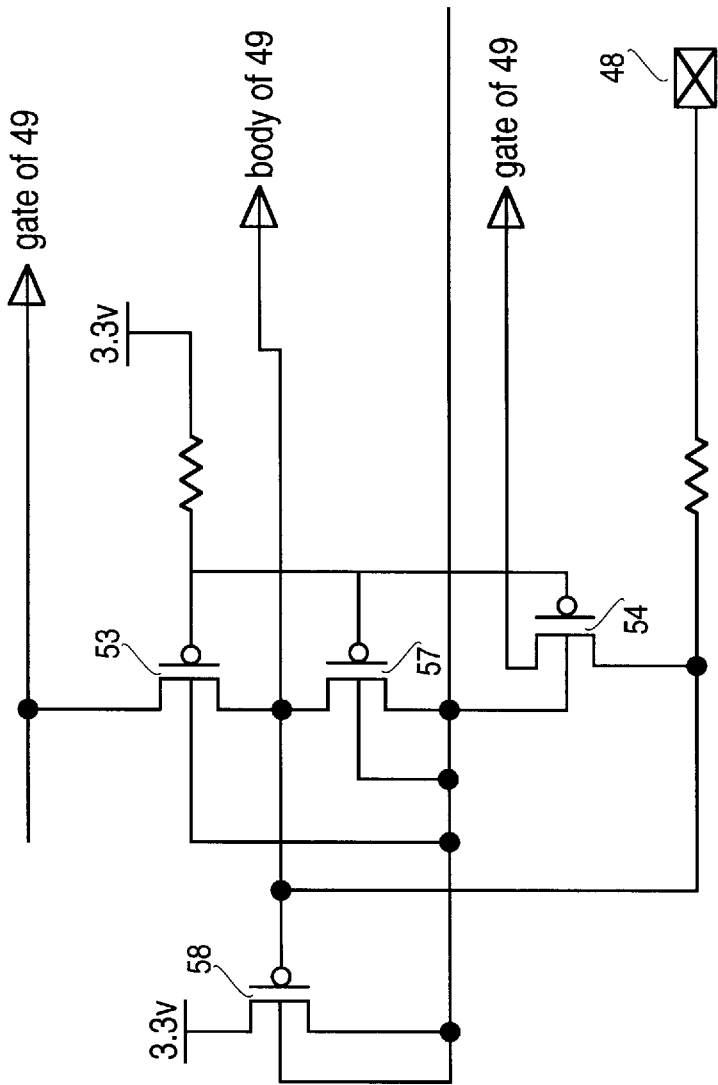
FIG. 5 is a circuit diagram of a body biasing circuit for transistor devices of the output buffer of FIG. 3 exposed to higher than normal source voltages.

As with the circuit of FIG. 2, the body of the output P transistor devices 49 (and other p devices) are joined to a body biasing circuit which detects the voltage level at the terminal 48 and functions as a voltage source for body biasing which mirrors the value of voltage at the output terminal 48; this source also applies a disabling voltage to the gates of the P devices 49 when the voltage at the output terminal is greater than 3.3 volts plus Vpt. The body biasing circuit is illustrated in more detail in FIG. 5. As may be seen, the body biasing circuit includes a P device 58 which is enabled when the output terminal voltage is below 3.3 volts minus Vpt to apply 3.3 volts as body bias to the P devices. The body biasing circuit also includes a P device 57 which is enabled when the output terminal 48 voltage is greater than 3.3 volts plus Vpt to pull up the body voltage to the output terminal voltage to eliminate current dissipation through the body diode of those transistor devices with a five volt level at the terminal 48. In addition, a pair of P devices 53 and 54 are connected to pull up the gate terminals of the P devices 49 to hold those devices off when output voltage is greater than 3.3 volts plus Vpt. Moreover, the devices are kept on by a gate voltage of 3.3 volts to reduce the voltage across the terminals of the devices 51 to relieve stress of the gate oxide of those devices.

In order to reduce overshoot at the terminal 48, the values of the devices 49, 50, and 51 have been very carefully characterized. Moreover, a pair of different levels of currents through the output devices have been provided by the use of the pair of predriver circuits 31 and a similar pair of N predriver circuits. As may be seen in FIG. 3, the SELECT signal allows data input to be transferred to one or both of the P predriver circuits 31 and thus to one or both of the P type output driver devices 49. Similarly, the select signal, allows one or a pair of output N driver devices 51 to be selected to furnish current to determine the voltage at the node 48. In one embodiment, the width of the path provided through the P type devices 49 may be selected to be 420 microns or 280 microns depending on the paths selected while the effective width of the path through the N type devices 50 and 51 may be selected to be 140 microns or 80 microns. This allows the change in voltage with time to be very closely controlled and both overshoot and undershoot to be greatly reduced at the terminal 48.

Figure 4:
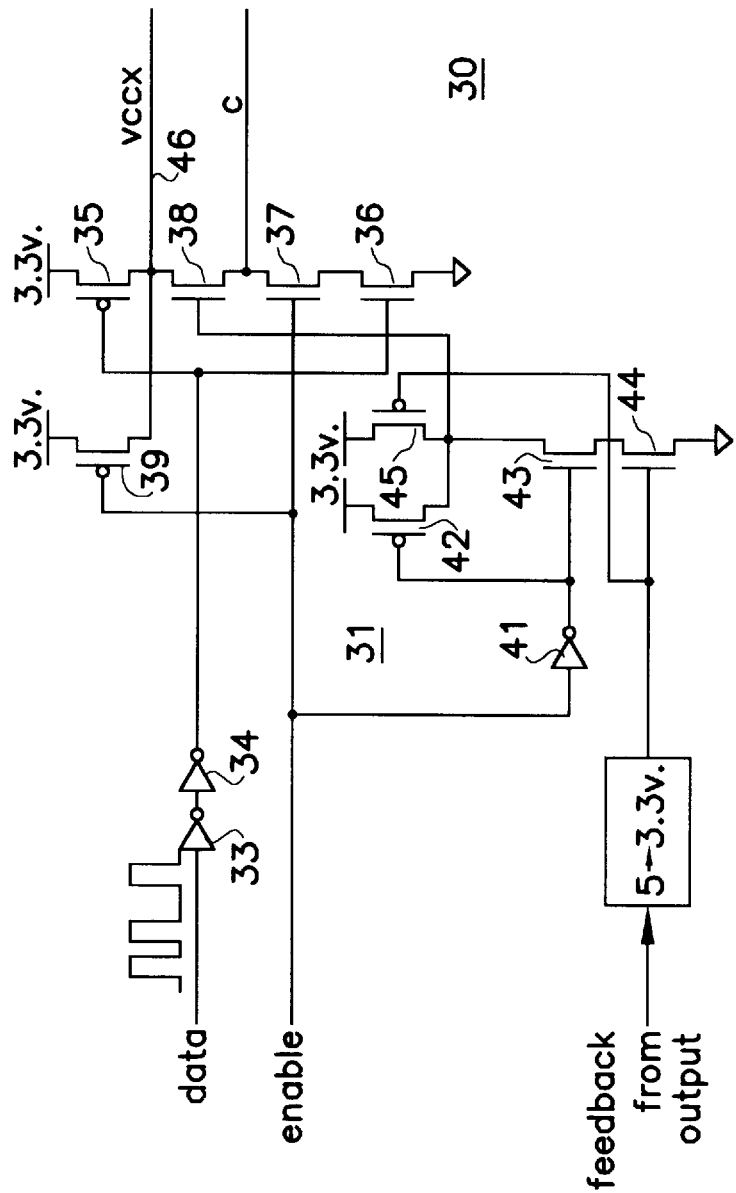
FIG. 4 is a circuit diagram of a portion of the output buffer of FIG. 3.

FIG. 4 illustrates in detail the circuitry of an improved P predriver circuit 31 which furnishes pulses to the positive output driver devices 49. As may be seen, the data input signals are applied to a gate terminal of P type FET transistor device 35 and to a gate terminal of a N type FET transistor device 36. These devices have their source and drain terminals connected in series with the source and drain terminals of two additional N type FET transistor devices 37 and 38 between a source voltage of 3.3 volts and ground. The enable signal is applied to the gate terminal of the N type device 37 which acts as a first switching circuit, to the gate terminal of another P type transistor device 39, and to a comparator circuit which ultimately produces a signal at the gate of the N type device 38 which acts as a second switching circuit. A feedback signal is applied at the gate terminals of a P type FET transistor device 45 and a N type FET transistor device 44. The feedback signal is low (e.g., ground) as long as the voltage at the output terminal of the buffer is low. If the voltage at the output terminal is high (3.3 volts or above), the feedback voltage is high (e.g., 3.3 v.).

Whenever the value at the output terminal of the buffer circuit 30 is low, the value of the feedback voltage is low so that the device 44 is not conducting while the device 45 is conducting. An enable signal (a high value) enables the N device 37 and is applied by the inverter 41 as a low value to the gate of a P device 42 and a N device 43. This disables the N device 43 while enabling the P device 42. The P device 42 applies a high value to enable the device 38. Thus, the two N devices 37 and 38 are each enabled whenever the output terminal of the buffer is less than five volts and below and the buffer 30 is enabled. This allows the high and low data values to control whether the P device 35 is enabled and is applying a high value at the output of this predriver 31 or the N device 36 is enabled and is applying a low value at the output of this predriver 31.

Presuming that the devices 35 and 36 are otherwise biased to conduct, a positive data input value tends to cause the device 36 to conduct and to disable the device 35; while a negative data input value tends to cause the device 35 to conduct and to disable the device 36. The predriver circuit 31 operates in this manner so long as enable signals are furnished to the circuit 30 and the voltage at the output terminal 48 remains low.

If enable signals are not furnished to the buffer circuit 30, a low value (e.g., ground) is applied at the gate of the N device 37 to disable that device. This low value is also applied to enable a P device 39 which furnishes a high value at the node 46. Disabling the device 37 and applying the high voltage at the node 46 assures that whatever the value is applied at the data input terminal, the value at the output of the predriver circuit 31 remains high.

While the voltage at the buffer output terminal 48 remains low, the transition from disable to enable turns on the device 37 and turns off the device 39 removing the high value at the node 46. The device 38 is on and remains on since a low output voltage provides a feedback of zero volts to the gate of the device 45. Consequently, the data values control the values applied by the devices 35 and 36 to the output of the predriver circuit 31.

In order to reduce the value of voltage which can be applied across the gate and drain terminals of the output P device 49 when a five volt potential is present at the output terminal 48 of the buffer 30 and the circuit 31 has been disabled and is turning on, the enable input is applied through a relatively weak inverter 41 to the gate of a weak P device 42 and the gate of a N device 43. If the buffer output is at five volts, a feedback voltage has enabled N device 44 and disabled the P device 45. Moreover, the device 43 is initially on since the circuit has been disabled so the gate of the N device 38 is held to just above ground and the device 38 is off. The enable signal (a high value) is inverted, slowly disables the N device 43 and enables the P device 42. Since the P device 42 is a weak device, it conducts very little current. Consequently, it takes a significant period for the high value to appear at the gate of the device 38. Consequently, disabling the device 43 and enabling the device 42 allows the value at the gate of the device 38 to rise slowly.

This slow rise protects against a situation in which a P transistor device in the output driver has been tristated by the application of a high value at its gate while the output value is at five volts. In the circuit of FIG. 1, this would cause five volts to be applied between the gate and drain terminals of the P device if the P device 49 were to receive a low data value when the circuit was enabled. However, the slow turn on of the device 38 isolates the gate terminal of the P driver device 49 by keeping the gate value high until the device 38 has turned on. This allows some time before a low valued data pulse can reduce the level at the gate of the output device 49 to the low value. This gives the output level at the terminal 48 time to drop so that dangerous stress does not exist on the device 49. The devices 36 and 37 of the P predriver circuit 31 have been designed to slow the slew rate of the falling transition of the inputs to the p-driver transistors 49 so that they turn on slower and reduce the overshoot. In one embodiment, these devices each have a channel width of 25 microns so that current flow is minimal. This reduction in channel width essentially eliminates any period during which static current flows through the output devices during operation of the circuit.

On the other hand, if the device 49 is tristated and the output terminal 48 is at five volts and a high data value is applied at the gate of the device 49, the high is immediately available at the gate so the slow turn on has no effect at the output terminal 48.

Moreover, once the predriver circuit 31 has been enabled and data is being transferred to the output drivers, the value at the output terminal 48 will be either ground or 3.3 volts. The device 43 will be off and the device 45 will be on enabling the device 38. At this point, the values of the devices 35 and 38 control the speed at which the value at the terminal 46 may be varied. Consequently, the inverter 41 and the slow device 42 have no effect in switching the terminal 46 after the circuit 31 has been enabled and switched on a first time.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An input/output buffer for computer circuitry comprising:
    a first P type transistor device responsive to data signals for selectively furnishing voltage from a first source of potential at a buffer input/output terminal,
    a first predriver circuit for furnishing data signals from a source to the P type transistor device, the first predriver circuit including means for slowing the application of data signals to the P type transistor device when the buffer input/output terminal is at a high level, the first predriver circuit comprising:
        a second P type transistor device,
        a second N type transistor device,
        circuit means joining source and drain terminals of the second P type transistor device and the second N type transistor device in series between first and second sources of potential,
        the circuit means comprising:
            means for slowly joining the second N type transistor device to a second means for joining when the input/output buffer is being enabled and a voltage higher than any internal voltage source exists at the buffer output terminal; and
            the second means joining the means for slowly joining to a predriver output terminal responsive to an enabling signal
    a first N type transistor device responsive to data signals for selectively furnishing voltage from a second source of potential at the buffer output terminal,
    a second predriver circuit for furnishing data signals from the source to the N type transistor device, and
    means for slowing the receipt of data signals at the first predriver circuit.

2. An input/output buffer as claimed in claim 1 in which the second N type transistor device in the predriver circuit and the second means are designed to transfer current at a rate to reduce ringing at the buffer output terminal.

3. An input/output buffer as claimed in claim 1 in which the means for detecting a voltage level at the buffer output terminal comprises a feedback circuit.

4. An input/output buffer as claimed in claim 1 in which the second means comprises third N type transistor device having source and drain terminals joining the second N type transistor device to the predriver output terminal, and
    the means responsive to a voltage level above a predetermined value at the buffer output terminal for slowing the joining of the second N type transistor device to the predriver output terminal comprises
    a fourth N type transistor device having source and drain terminal joining the third N type transistor device to the predriver output terminal, and
    means for slowing the turn on of the fourth N type transistor device in the presence of feedback from the buffer output terminal.

5. An input/output buffer as claimed in claim 1 further comprising a circuit for applying bias voltages to reduce potential differences across the P type transistor device if a voltage level at the buffer output terminal is greater than a predetermined value.

6. An input/output buffer for computer circuitry comprising:
    a P type transistor device responsive to data signals for selectively furnishing voltage from a first source of potential at a buffer input/output terminal,
    a first predriver circuit for furnishing data signals from a source to the P type transistor device, the first predriver circuit including a comparison circuit for slowing the application of data signals to the P type transistor device when the buffer input/output terminal is at a high level, the first predriver circuit comprising:

a second P type transistor device having source and drain terminals connected between a first source of potential and a predriver output terminal, a second N type transistor device having source and drain terminals connected between a second source of potential and the predriver output terminal, a first switching circuit for joining a drain terminal of the second N type transistor device to the predriver output terminal when high valued data is present, and a second switching circuit for joining the first switching circuit to the predriver output terminal, the second switching circuit responding to output signals from the comparator circuit, a N type transistor device responsive to data signals for selectively furnishing voltage from a second source of potential at the buffer output terminal, a second predriver circuit for furnishing data signals from the source to the N type transistor device, and a delay circuit for slowing the receipt of data signals at the first predriver circuit.

7. An input/output buffer as claimed in claim 6 in which the comparator circuit comprises:

a first circuit for enabling the second switching circuit in the absence of a voltage lower than the first potential at the buffer output terminal, and a second circuit responsive to the presence of a voltage level above the first and second potentials at the buffer output terminal and an enabling signal for disabling the second switching circuit.

8. An input/output buffer as claimed in claim 7 in which the first and second switching circuits each comprise additional N type transistor devices, and in which the N type transistor devices are designed to transfer current at a rate to reduce ringing at the buffer output terminal.

9. An input/output buffer as claimed in claim 7 which further comprises a feedback circuit for detecting a voltage level at the buffer output terminal.

10. An input/output buffer as claimed in claim 7 in which the circuit responsive to the presence of a voltage level above the first and second potentials at the buffer output terminal and an enabling signal for slowly enabling the second switching circuit comprises:

a weak transistor device connected to furnish voltage from the first source of potential to the second switching circuit in response to an enabling signal.

11. An input/output buffer as claimed in claim 6 further comprising a circuit for applying bias voltages to reduce potential differences between termninals of the P type transistor device if a voltage level at the buffer output terminal is greater than a predetermined value.

12. A method of providing data at an input/output terminal of a computer circuit comprising the steps of:

providing an input data stream, transferring the input data stream to a N predriver circuit, transferring the input data stream after a preselected delay to a P predriver circuit, enabling the N predriver circuit to begin generating an output, enabling the P predriver circuit to begin generating an output, the step of enabling comprising the steps of:

coupling a signal through a first switching circuit having a slower rate to a second switching circuit when an input/output buffer is being enabled and a voltage higher than any internal voltage source exists at the output terminal; and the second switching circuit coupling the first switching circuit to a predriver output terminal if an enabling signal is detected; and, generating output signals at the input/output terminal in response to output provided by the N and P predriver circuits.

13. A method of providing data at an input/output terminal as claimed in claim 12 in which the delay is selected to delay the initiation of signals from the P predriver circuit.

14. A method of providing data at an input/output terminal as claimed in claim 12 in which the step of enabling the P predriver circuit at a first rate or a slower rate than the first rate comprises:

testing the voltage at the input/output terminal, determining whether the predriver circuit is just being enabled, enabling the P predriver at the slower rate if the voltage at the input/output terminal is above a highest potential level furnished by a voltage source within the computer circuit and the predriver circuit is just being enabled, and enabling the P predriver at the first rate if the voltage at the input/output terminal is below a highest potential level furnished by a voltage source within the computer circuit or the predriver circuit has already been enabled.

15. A method of providing data at an input/output terminal as claimed in claim 12 comprising a further step of applying bias voltages to reduce potential differences across the P type transistor devices if a voltage level at the input/output terminal is greater than a predetermined value.

* * * * *